US008265295B2

(12) United States Patent
Troxel

(10) Patent No.: US 8,265,295 B2
(45) Date of Patent: Sep. 11, 2012

(54) METHOD AND APPARATUS FOR IDENTIFYING FEEDBACK IN A CIRCUIT

(75) Inventor: Dana Troxel, Marysville, WA (US)

(73) Assignee: Rane Corporation, Mukilteo, WA (US)

( * ) Notice: Subject to any disclaimer, the term of this patent is extended or adjusted under 35 U.S.C. 154(b) by 1505 days.

(21) Appl. No.: 11/351,861

(22) Filed: Feb. 8, 2006

(65) Prior Publication Data

US 2006/0215852 A1 Sep. 28, 2006

Related U.S. Application Data

(60) Provisional application No. 60/660,667, filed on Mar. 11, 2005.

(51) Int. Cl.
*H04B 15/00* (2006.01)
*H04R 27/00* (2006.01)
*H03G 5/00* (2006.01)

(52) U.S. Cl. .......... 381/93; 381/83; 381/94.1; 381/94.2; 381/94.3; 381/101; 704/226

(58) Field of Classification Search .................... 381/93, 381/83, 59, 95–98, 94.1–94.3, 318; 704/226
See application file for complete search history.

(56) References Cited

U.S. PATENT DOCUMENTS 4,079,166 A 3/1978 Patronis
4,088,835 A 5/1978 Thurmond et al.
4,091,236 A 5/1978 Chen
4,382,398 A 5/1983 O'Neill
5,245,665 A * 9/1993 Lewis et al. .................... 381/93
5,442,712 A 8/1995 Kawamura et al.
5,677,987 A * 10/1997 Seki et al. .................... 704/226
5,999,631 A 12/1999 Porayath et al.
6,245,665 B1 * 6/2001 Yokoyama .................... 438/623
6,404,895 B1 * 6/2002 Weidner .................... 381/318
7,227,959 B2 * 6/2007 Abraham .................... 381/83
7,302,070 B2 * 11/2007 Blamey et al. .................... 381/318
7,536,022 B2 * 5/2009 Von Buol .................... 381/318
* cited by examiner

*Primary Examiner* — Devona Faulk
(74) *Attorney, Agent, or Firm* — Graybeal Jackson LLP; Kevin D. Jablonski

(57) ABSTRACT

A system and method for analyzing a signal to monitor the dynamics of its magnitude and frequency characteristics over time. An electronic circuit for identifying feedback in an audio signal, formed in accordance with embodiments of the invention may comprise a feedback control block operable to determine a candidate frequency having potential feedback such that the feedback control block is further operable to perform an iterative analysis of the magnitude of the audio signal at the candidate frequency to determine the growth characteristics of the signal. The electronic circuit may further include a test filter block operable to deploy a test filter at a candidate frequency and a permanent filter block operable to deploy a permanent filter at the candidate frequency if the feedback control block determines that the growth characteristics of the signal at the candidate frequency comprises feedback characteristics after the test filter has been deployed.

20 Claims, 6 Drawing Sheets

METHOD AND APPARATUS FOR IDENTIFYING FEEDBACK IN A CIRCUIT

CROSS REFERENCE TO RELATED APPLICATION

This application claims priority from U.S. Provisional Application 60/660,667 titled, "FEEDBACK SUPPRESSOR METHOD AND APPARATUS," which was filed on Mar. 11, 2005, and which is incorporated by reference.

BACKGROUND OF THE INVENTION

Acoustic feedback is a common problem encountered in any typical closed loop audio amplification system. Generally speaking, feedback arises in an amplification system at frequencies where the loop gain of the electronic circuit is greater then or equal to unity and the system phase is positively reinforced such that particular frequencies may grow uncontrollably. In such a system, feedback will occur at the specific frequencies that satisfy these specific gain and phase criteria. The magnitude of the feedback frequencies will grow at a rate that is determined by the gain at those frequencies and a delay associated with various parameters of the amplification system. Once feedback instability is initiated, typically the only way to stop the growth of the magnitudes of signals at the feedback frequencies is to reduce the overall system gain below the point of unity gain. Then, the growing feedback frequencies will decay and go away, but at the expense of an overall reduction in gain across the entire frequency spectrum of the amplification system.

In the past, a number of feedback detection and feedback correction/suppression systems have been employed in an effort to deal with feedback. Identification and control of feedback may be most pertinent to a live sound reinforcement setting where a sound engineer must quickly be able to deal with feedback by identifying the fact that feedback exists and determining the best and fastest way to deal with the feedback (i.e., eliminate it or at least reduce it) without dramatically affecting the overall signal, (i.e., the sound presentation of the performance).

Several past solutions regarding feedback problems involve identifying sustained magnitudes of signals at a set frequency and then reducing overall gain or applying a notch filter at the identified frequency. In one example, Patronis, U.S. Pat. No. 4,079,199 (granted Mar. 14, 1978), discloses a system that detects a persistent frequency component, then reduces the broad band system gain until the persistent frequency component goes away. Such a system, though successful at stopping feedback, has drawbacks. The purpose of the audio amplification system is to increase the gain of the person speaking/playing into the microphone so that he or she can be heard. If the feedback suppressor reduces the overall gain, then the effectiveness of the amplification system is negated because the overall signal gain is reduced by the feedback suppressor at an equivalent rate in which the amplifier may attempt to increase the overall signal gain. Furthermore, some acoustic sound waves having persistent frequencies, such as a holding a long note or providing a solid steady bass tone, are typically part of musical performances. A system that employs such a feedback suppressor will often mistakenly turn down the amplification of musical instruments when sustained musical notes are present.

In an attempt to make the suppression of feedback less noticeable, Chen, U.S. Pat. No. 4,091,236 (granted May 23, 1978) discloses using automatically tunable notch filters to narrow the frequency band that is affected by a gain reduction. Thus, instead of reducing all frequencies across the audio spectrum, only frequencies in which a sustained presence of signal magnitude is detected (which is identified by prior art systems as feedback, regardless of whether or not it actually is) are reduced. Of course, this solution still does not address distinguishing between actual feedback and sustained musical tones.

Later developments in the prior art have begun attempting to distinguish between actual feedback and sustained musical tones. In specific, Lewis et al., U.S. Pat. No. 5,245,665 (granted Sep. 14, 1993) disclose a system that is capable of some discrimination of musical tones from feedback. In this disclosure, the system attempts to distinguish musical tones by identifying harmonics that are typically produced by most musical instruments. That is, almost all instruments (including the human voice) produce notes at various fundamental frequencies in which the human ear can easily identify (e.g. middle C, A#, etc.). These instruments also produce harmonics that allow the human ear to distinguish between instruments (e.g., a flute produces harmonics different form a female voice which is, in turn, different form a male voice). Using this natural phenomena, the harmonic content of the input signal may be analyzed by the feedback suppressor system of Lewis et al. to distinguish between fundamental frequencies that have related harmonics (probably musical notes) and fundamental frequencies that do not have related harmonics (probably feedback). If the feedback analyzer finds a fundamental frequency being greater then any of its harmonics or sub harmonics by a predetermined factor (such as 33 dB), then the identified frequency may be designated a feedback component which triggers the deployment of a notch filter.

While checking for harmonics does give an added measure of protection against the false identification of music as feedback, there are still shortcomings with this method. Multiple feedback frequencies can arise naturally that are harmonically related to not only the feedback itself but possibly to other actual musical notes. Natural distortion of the audio amplification system can also produce harmonics that are similar in strength to those generated by musical instruments. When these situations arise, the prior art fails to place notch filters allowing feedback to go unchecked. Conversely there are times when desirable sinusoidal signals with weak harmonics are detected falsely by the system as feedback and notches are deployed causing unnecessary degradation of the system. These signals include test tones commonly used to test the audio amplification system, a human whistle and other more tonal instruments such as a flute.

As a result, analyzing a signal for feedback based on related harmonics of sustained frequencies is wrought with potential misapplication of feedback suppression filters. The prior art cannot be relied upon to effectively distinguish sustained musical tones from feedback, especially as musical instruments gravitate from acoustic to electronic where harmonics are less prevalent.

SUMMARY OF THE INVENTION

According to one embodiment of the invention, a system and method for analyzing a signal to monitor the dynamics of its magnitude and frequency characteristics over time is realized. An electronic circuit for identifying feedback in an audio signal, formed in accordance with embodiments of the invention may comprise a feedback control block operable to determine a candidate frequency having potential feedback such that the feedback control block is further operable to perform an iterative analysis of the magnitude of the audio signal at the candidate frequency to determine the growth characteristics of the signal. The electronic circuit may further include a test filter block operable to deploy a test filter at a candidate frequency and a permanent filter block operable to deploy a permanent filter at the candidate frequency if the feedback control block determines that the growth characteristics of the signal at the candidate frequency comprises feedback characteristics after the test filter has been deployed.

The present invention overcomes the problems found in the prior art, of not adequately distinguishing desirable sounds from feedback, by using the characteristics of feedback (i.e., growth characteristics over time), instead of analyzing harmonically related frequencies (in real-time only) to discriminate feedback. First, it monitors the magnitude growth of constant frequency components to identify potential feedback. In addition to consistent frequencies that grow over time being identified as potential feedback, consistent frequencies with no significant magnitude change are identified as potential feedback based on their lack of dynamics, relative strength and duration. Once identified, a test notch filter may be deployed and the suspect frequency may be monitored to see if decay is observed at the input to the system coincident to the placement of the test notch filter. Frequencies associated with non-feedback sounds, such as those associated with a signal generator or musical instruments, will not always decay coincident with the placement of the notch filter, when measured upstream of the notch. However, feedback frequencies will decay within a finite amount of time coincident with the placement of the test notch filter. This allows the invention to have an enhanced ability over the prior art in distinguishing feedback from other sounds.

In addition to the benefit from monitoring the decay characteristics upstream of the test notch filter, the present invention is able to identify potential feedback that has multiple frequencies that naturally appear at locations that are harmonically related to each other. This kind of harmonically related feedback can occur naturally in a system due to its magnitude and phase characteristics and the prior art would not be able to detect this as feedback and still maintain its ability to distinguish music or other desirable sounds. Harmonics can also occur naturally in a sound amplification system due to distortion in system elements such as caused by speakers, microphones etc. In this case strong feedback can have harmonics that will keep the prior art from identifying it as feedback. The present invention does not have this problem because it does not use the lack of harmonically related frequencies as an identifying characteristic of feedback.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed above without departing from the spirit and scope of the present invention. The present invention is not intended to be limited to the embodiments shown, but is to be accorded the widest scope consistent with the principles and features disclosed or suggested herein.

Figure 1:
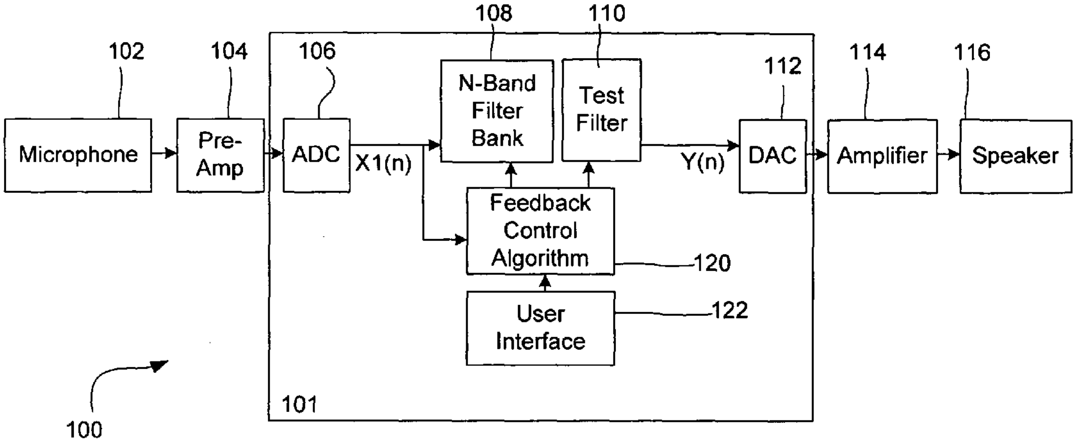
FIG. 1 shows a block diagram of feedback suppression circuit in connection with a typical sound amplification system according to an embodiment of the invention.

FIG. 1 shows a block diagram of feedback suppression circuit 101 as typically embodied within a sound amplification system 100 according to an embodiment of the invention. The sound amplification system 100 includes a number of components that may or may not be present in conjunction with the feedback suppression circuit 101. As such, the system described herein with respect to FIG. 1 is for exemplary purposes only and any of the described components need not be present in a feedback suppression circuit 101 formed according to various embodiments of the present invention.

In FIG. 1, the sound amplification system 100 includes a microphone 102 that converts acoustic sound waves into a series of electrical signals, i.e., an analog audio signal. Each electrical signal may then be amplified by a microphone preamplifier 104 and then sent to an Analog-to-Digital Converter (ADC) 106. The ADC 106 converts an analog signal to a digital signal according to known standards and typically converts the analog signal into a digital signal having a bit depth of 24 bits at a sample rate of 48 kHz and higher. As the bit depth and sample rate increase, so does the cost and complexity of the system. As such, an optimal bit depth and sample rate is 24 bits at 48 kHz as is common in today's applications. Other sample rates, such as 96 kHz, and other bit depths, such as 32 bits, may also be used in some applications.

The ADC 108 generates a digital signal, labeled as X1(*n*), which may then be sent to the feedback control algorithm 120 and analyzed accordingly (described in greater detail below with respect to FIGS. 2-7) to determine if a potential feedback frequency is present in the signal. As a general overview, if a potential feedback frequency is detected, then the feedback control algorithm 120 deploys a test filter 110. The depth and width of the test filter 110 used may be determined by various user parameters through a user interface 122 and the signal X1(*n*) may be monitored for changes based on the deployment of the test filter 110.

As the feedback control algorithm 120 monitors the signal X1(*n*) to determine if any decay seen is consistent with the feedback detected, the feedback control algorithm 120 may then deploy a permanent filter via filter bank 108 and the test filter 110 may be removed. The signal Y(n) represents the input signal X1(*n*) after being filtered by blocks 108 and 110. The signal Y(n) may then be sent to a Digital-to-Analog Converter (DAC) 112 with equivalent parameters to those of the ADC 108. The analog signal may then be amplified by amplifier 114 and converted back to acoustic sound waves by a speaker 116.

Typically, the feedback suppression circuit 101 may be embodied in a rack-mounted unit consistent with audio components of the industry. Alternatively, the feedback suppression circuit 101 may be realized wholly within a computing environment such as a rack mountable computer, a standalone computer, a server computer, a laptop computer, or a desktop computer. Similarly, the user interface 122 me be embodied in a program running on an attached computing environment or computer platform from which users parameters are controlled. Also alternatively, the user interface 122 may be a set of switches configured by a user on an attached piece of hardware.

Figure 2:
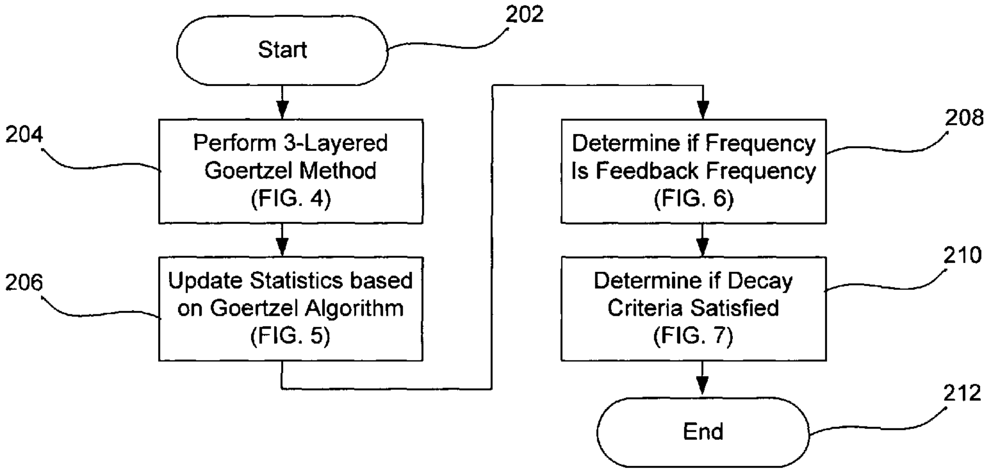
FIG. 2 is a flow chart of an overview of a method for detecting and suppressing feedback according to an embodiment of the invention.

FIG. 2 is a flow chart of an overview of a method for detecting and suppressing feedback according to an embodiment of the invention. When a signal is received at the feedback suppression circuit 101 (as shown in FIG. 1), and converted to a digital format, this method may be used to detect and suppress feedback in the digital signal stream. The method begins at step 202 as the digital signal stream is received. At step 204, a three-layered Goertzel method is used to identify potential feedback frequencies. This is described in greater detail below with respect to FIG. 4. Then, at step 206, after potential feedback frequencies are identified, these frequencies are monitored for magnitude and bandwidth changes. This is described in greater detail below with respect to FIG. 5. As changes are monitored, the method determines if the identified potential feedback frequencies are actual feedback frequencies at step 208. This is described in greater detail below with respect to FIG. 6. If such is the case, then feedback frequency decay is verified at step 210 and the method ends at step 212. This is described in greater detail below with respect to FIG. 7.

Figure 3:
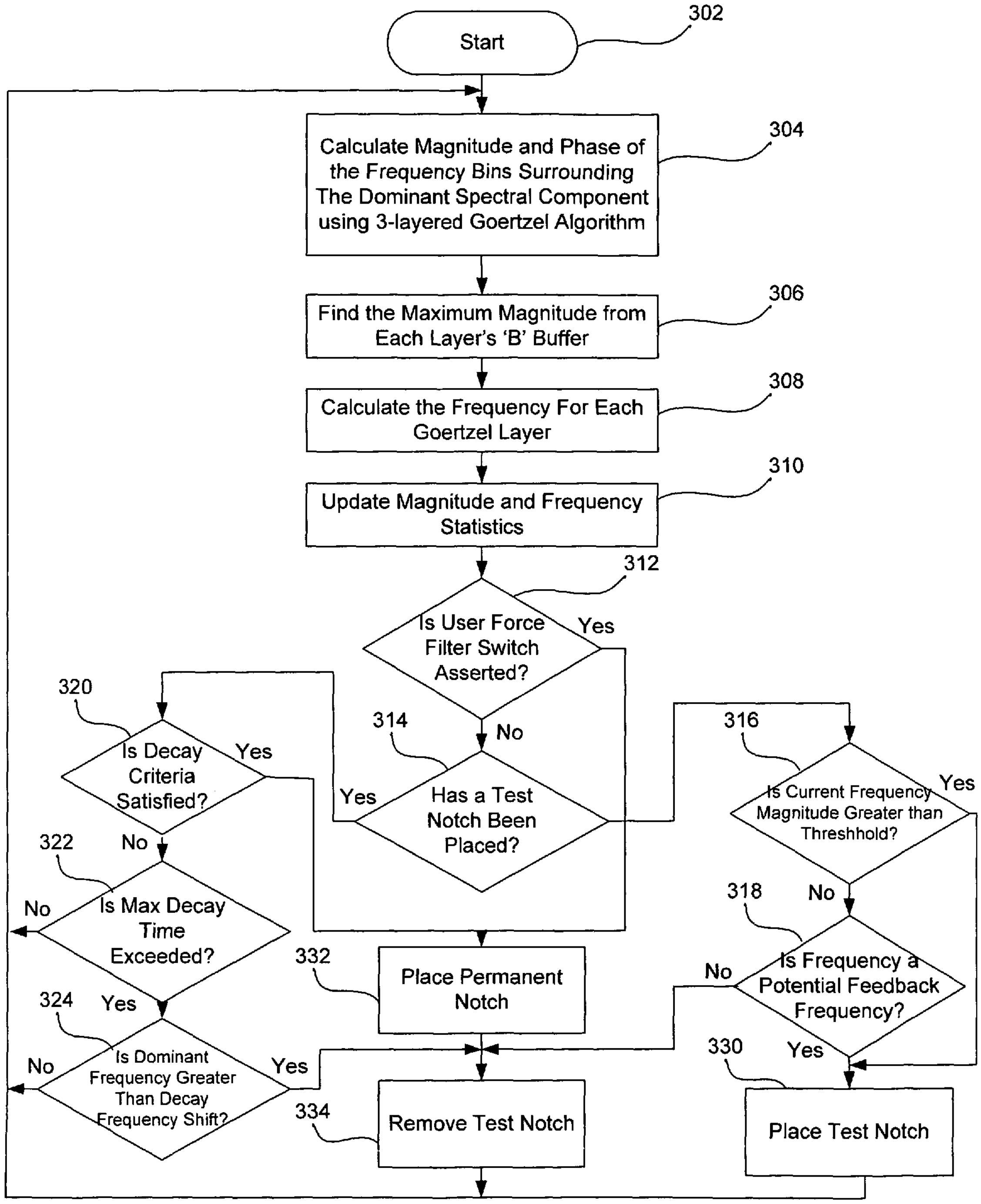
FIG. 3 is a flow chart of a feedback control algorithm showing a feedback suppression method according to an embodiment of the invention.

FIG. 3 is a flow chart of a feedback control algorithm showing a feedback suppression method according to an embodiment of the invention. The method shown in FIG. 3 embodies various sub-methods that are described in greater detail with respect to FIGS. 4-7. FIG. 3 is a general overview of steps organized from a different perspective than FIG. 2. The method begins at step 302 and the first substantive step of the feedback control algorithm is to analyze the signal X1($n$) by calculating the magnitude and phase of the dominant spectral component using the three-layered Goertzel algorithm (described below with respect to FIG. 4) at step 304.

The Goertzel algorithm is commonly used in digital signal processing as a means of computing the Discrete Fourier Transform (DFT) of a digital signal stream. The algorithm is described in detail in "Discrete-Time Signal Processing", Alan V. Oppenheim, Ronald W. Schafer, Prentice Hall Signal Processing Series 1989, pp. 585-587, and is discussed in brief detail herein. The Goertzel algorithm provides a means for recursively calculating one band of frequencies commonly referred to as a "frequency bin" of the DFT. The bandwidth of each frequency bin calculated is equal to the (Sample Frequency)/(Number of Samples). In this method, three distinct Goertzel calculations are used to garner information about the digital signal according to three layers: a wide-band layer, a mid-band layer, and a narrow-band layer. Each of the three Goertzel layers successively zooms in on the largest spectral component in the digital signal.

This three-layered Goertzel approach used to zoom in on frequency has two significant benefits. The first benefit comes from comparing frequencies calculated on frequency bins of differing widths. Greater frequency resolution is obtained by processing frequency bins spanning a smaller band of frequencies (narrower frequency bins) and less frequency resolution is obtained by processing frequency bins spanning a larger band of frequencies (wider bins). Consistent frequency calculation stemming from frequency bins of various widths is a metric that proves useful when determining the presence of a potential feedback component. The second benefit is that the three-layered Goertzel algorithm consumes fewer processing cycles and uses significantly less memory, during each pass of the algorithm, to yield greater frequency resolution then other forms of a Discrete Fourier Transform. The three-layered Goertzel algorithm is described further below with respect to the more detailed flow chart in FIG. 4.

Figure 5:
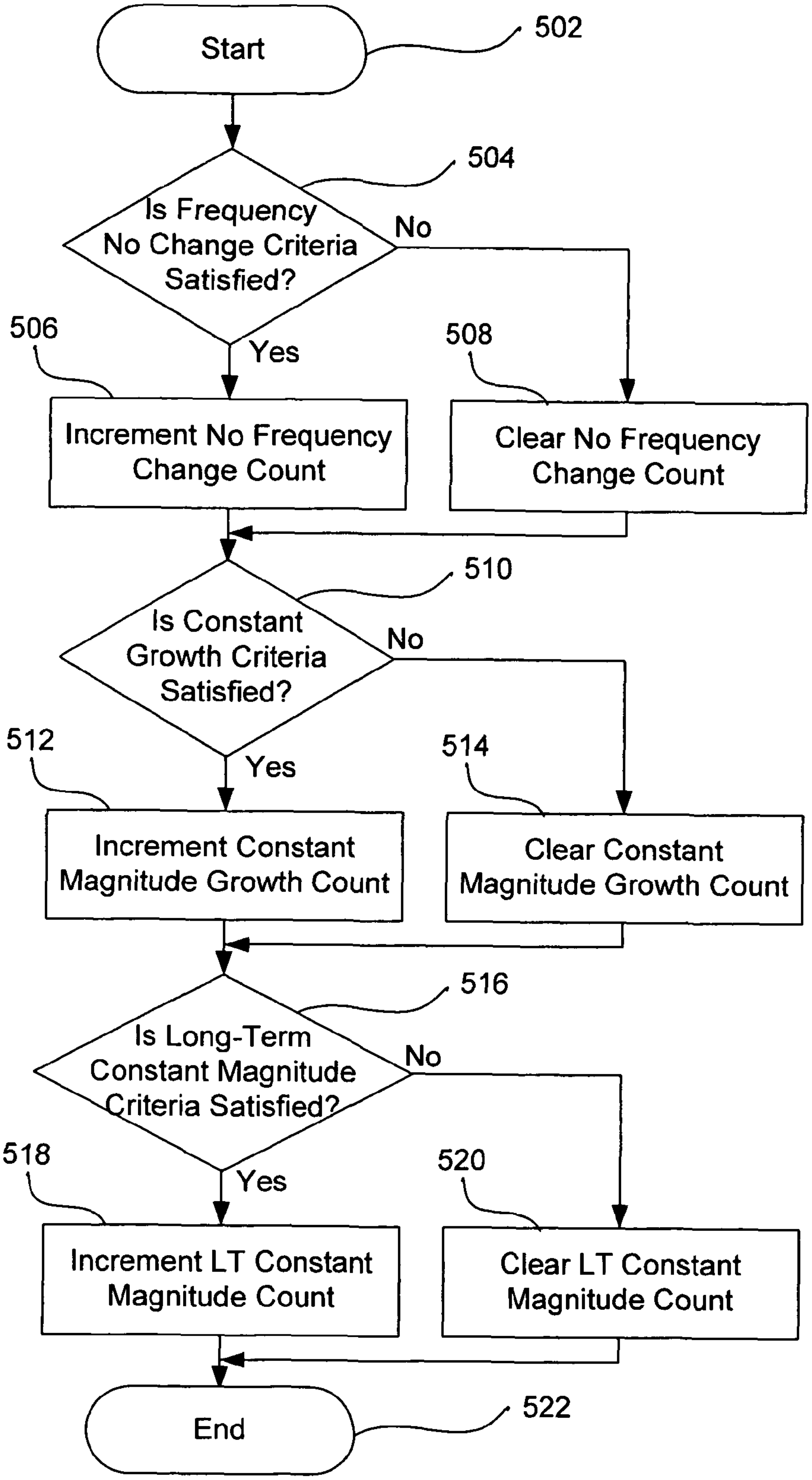
FIG. 5 is a more detailed flow chart of the process for updating statistics of the magnitude and frequency of a signal being analyzed from FIG. 2 according to an embodiment of the invention.

For now, it is enough to further the discussion to describe the process in terms of results. Specifically, at step 306, the maximum magnitude from each layer is determined such that the frequency associated with the maximum magnitude is determined for each layer at step 308. The maximum magnitude for each of the Layer's 'B' (described below) buffer bin is determined. The frequency associated with each of the maximum bins is calculated based on the phase difference between the phase associated with the frequency bin found in buffer 'A' and buffer 'B' and the center frequency associated with the frequency bin. In this manner, as each recursive pass of the method is performed, magnitude and frequency information may be updated, at step 310, from iteration to iteration in order to garner data about the growth and/or decay of the magnitude of the frequencies of interest. The process for updating these statistics is shown in FIG. 5 and described below.

At this point on the overall method of FIG. 3, a user-set parameter is analyzed to determine the path of the method. A user may set a parameter to force an asserted filter. This may typically used when a user knows feedback to be present. Thus at step 312, if the force filter parameter is set, the process immediately moves to step 332 to place a permanent filter. If the force filter parameter is not set, then the updated information is then used to determine if the current frequency is a potential feedback frequency. Thus, at step 314, if no test filter has yet to be placed, the method moves to step 316 where it is determined whether the frequency's magnitude exceeds a threshold. This is done by comparing the current narrow-band magnitude directly to the user selected maximum threshold. If the current narrow-band magnitude is greater than the user-set maximum, then the method moves to step 330 and places a test filter and then starts over. If the threshold is not exceeded, then the method further determines, at step 318, whether the frequency is a potential feedback frequency. If so, the method again moves to step 330 and places a test filter and then starts over. If not, the method moves to step 334 to remove any previously placed test filter. The manner in which the frequency is analyzed as a potential feedback frequency as described below with respect to FIG. 5.

When a test filter is placed at step 332, there are two parameters in the user interface that may be set to control the filter characteristics. The first parameter is the default bandwidth. The new test filter bandwidth is set equal to the default bandwidth according to the setting in the user interface. The second user interface parameter is the maximum filter depth. The new test filter is deployed at a depth equivalent to the maximum filter depth as also specified in the user interface.

Returning to the reciprocal path at step 314, if a test filter has already been placed, then subsequent digital samples are analyzed for signal decay. If at step 320, decay criteria are satisfied, then a permanent filter is immediately placed at step 332 and the test filter is removed at step 334. If the decay criteria are not satisfied, then it next determined of the maximum decay time is reached at step 322. If the decay criterion is not satisfied and the elapsed time is less then a Maximum Decay Time, then the feedback control algorithm repeats as before until greater then the Maximum Decay Time has elapsed and the decay criterion is still not satisfied. At this point, another check is performed to see if the dominant frequency has changed by more then Decay Frequency Shift as measured in Hz at step 324. The feedback control algorithm continues to iterate until the dominant frequency does shift. When the frequency shift occurs the test filter is removed. The decay criteria and determination is described in greater detail with respect to FIG. 7 below.

If the decay criterion is satisfied and there are no other filters within approximately 1.5% of the current frequency, then a new filter is deployed in the N Band Filter Bank and the test filter is removed. This new filter is deployed at a depth of −0.5 dB at the default bandwidth that is set in the user interface. If there is a filter already deployed within 1.5% of the current frequency then the notch depth is deepened by 0.5 dB at the current frequency using the current bandwidth of the already deployed notch. The feedback control algorithm shown in FIG. 3 repeats continuously.

Determining Frequency and Magnitude with Three-Layered Goertzel Algorithm

As discussed briefly above, a three-layered Goertzel approach is used to determine the most dominant spectral component in a digital audio signal at any given moment in time. Using this approach, a wide-band, a mid-band and a narrow-band analysis can be used to identify and deal with feedback in more efficient and effective manner. Furthermore, each layer uses an 'A' buffer and a 'B' buffer for comparison from iteration to iteration. In this manner, calculations based on six different passes (three bands each having two buffers) can zero in on potential feedback frequencies. Thus, to begin with, the iterative method starts, at step 402 and sets the band to wide and the buffer to 'A' at step 404.

Next, the method determines which band is set. If this is the first pass, then the band was initially set to wide and the buffer was set to 'A'. In subsequent iterations the band and the buffer will change. At decision blocks 406 and 408, the method proceeds to step 410 if set to wide-band, step 412 if set to mid-band and step 416 if set to narrow-band. At each respective branch, the Goertzel buffers are set for the respective band (i.e., set to wide-band at step 410, set to mid-band at step 414 and set to narrow-band at step 418). Then, having the Goertzel buffers set, the Goertzel algorithm may be performed for all frequency bins in the particular band being analyzed. The frequency bins differ for each band as discussed below.

The spectral bandwidth for the human ear for audio is approximately 20,000 Hz. Thus, in order to have the first layer (wide-band) of the three-layered Goertzel algorithm span a frequency range of 20,000 Hz, 25 bins each with a width of 800 Hz is calculated (20,000 Hz=25*800 Hz). At a sample rate of 48,000 Hz this means that each bin is recursively calculated every 48000/800 or 60 samples.

After the 25 bins of the first layer are calculated, the magnitude and phase for each bin are calculated and stored in the A buffer. Then the Goertzel algorithm is reinitialized with the same frequency and width parameters used for the 'A' buffer calculation. The Goertzel algorithm is then performed again with the results being stored into the 'B' buffer. The 'B' buffer is then examined to find the bin with the largest magnitude. The frequency associated with this bin then becomes the center frequency for the second layer Goertzel initialization as set at step 412.

The second layer consists of 25 bins recursively calculated every 240 samples. This means that there will be 12 bins on either side of a central bin focused on the largest bin of the first layer. The bin width of the second layer is selected as 48000/240 or 200 Hz. This means that the 25 bins span a frequency bandwidth of 25*200 or 5000 Hz. After the second layer calculations have completed and are stored into their respective 'A' and 'B' buffers the bin with the largest magnitude is then found and becomes the focus of the third layer. The third layer has a bin width of 16 Hz. This means that the recursive calculations take 3000 samples to complete. The third layer calculation proceeds in a manner similar to the first and second layers as the maximum magnitude found in the mid-band calculations becomes the center frequency for the narrow-band calculations at step 416 with their parameters being stored in their respective 'A' and 'B' buffer locations. This means that one complete set of 'A' and 'B' buffers can be calculated every ((60*2)+(240*2)+(3000*2))/48000 seconds or approximately 138 ms.

In the embodiment described herein, the feedback control algorithm uses N=25 which corresponds to 25 frequency bins in each band. The number of frequency bins may be greater or lesser depending on the system's needs for speed of resolution and calculation capacity.

As the Goertzel algorithm compiles data at step 420, a number of iterations are completed to ensure consistent data. The recursive Goertzel algorithm (step 420) continues until M iterations are complete as determined at step 422. For the wide-band case, M=60, for the mid-band, M=240 and for the narrow-band, M=3000 iterations. After the requisite number of iterations, the magnitude for each frequency bin is then calculated at step 424, followed by the phase calculation for each frequency bin at step 426. Next the buffer is determined at step 428. The first time through the calculations are for buffer 'A' so the magnitude and phase are stored in the 'A' buffer at step 420. The buffer variable is the set to 'B' at step 432 and the method repeats, this time storing the magnitude and phase in the 'B' buffer at step 434 and setting the buffer variable back to 'A' at step 436. The band variable is then checked at steps 438 and 440 to determine whether or not to continue the method. If the band variable is initially set to wide, then it moved to indicate mid at step 444. Likewise, if the band variable is now set to mid, then it is moved to indicate narrow at step 446. Finally, if this is the last iteration of the method, then the band is set back to wide at step 442 before ending at step 450.

Figure 4:
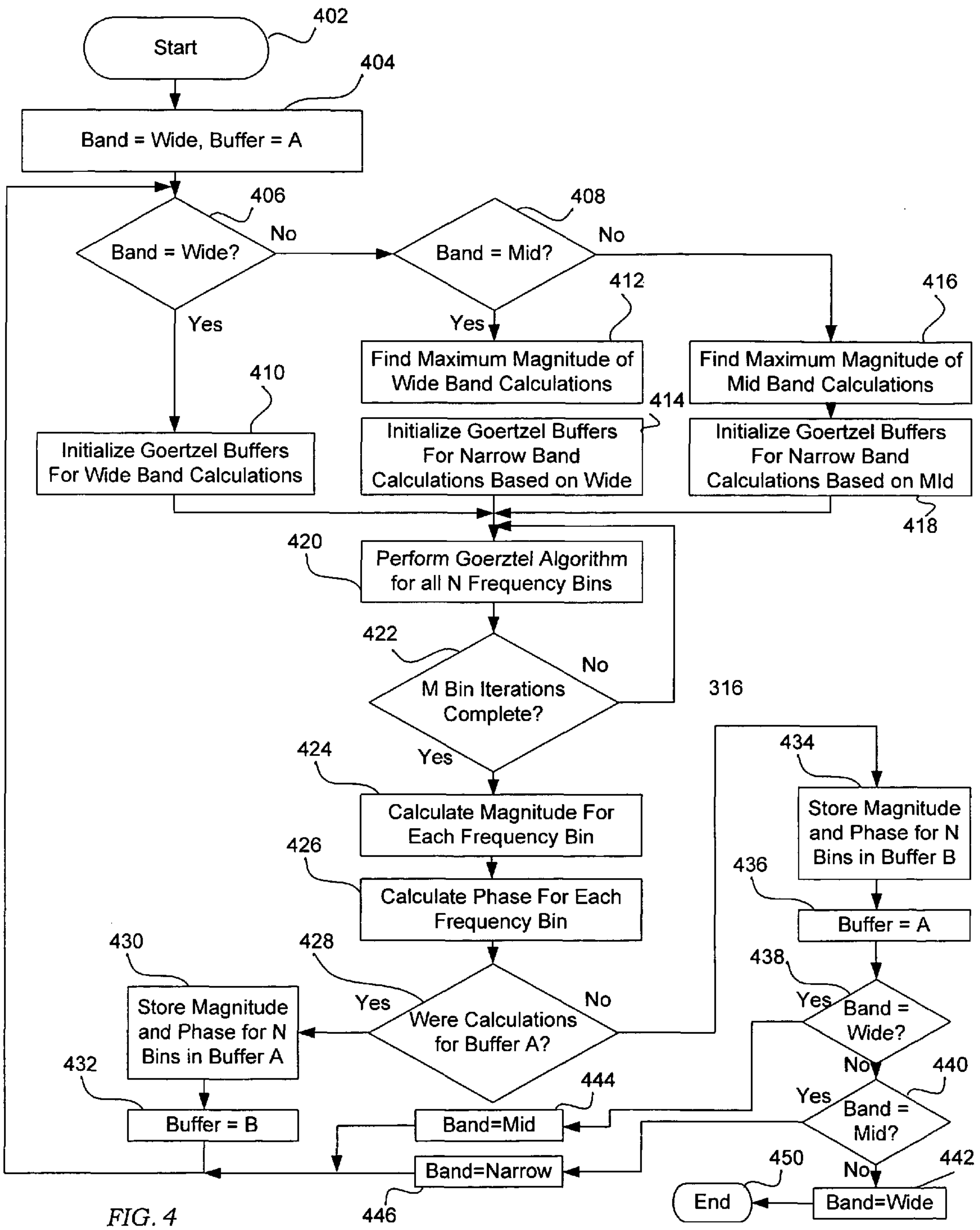
FIG. 4 is a more detailed flow chart of a three-layered Goertzel algorithm from FIG. 2 according to an embodiment of the invention.

When the three-layered algorithm of FIG. 4 completes the six buffers (one 'A' and one 'B' buffer for each of the three band types, wide, mid and narrow) the magnitude and phase information associated the N frequency bins from each pass of the Goertzel algorithm is then returned as updated information at step 310 of FIG. 3.

Updating the Magnitude and Frequency Statistics

FIG. 5 is a more detailed flow chart of the process for updating statistics of the magnitude and frequency of a signal being analyzed from FIG. 2 according to an embodiment of the invention. The statistics determined after each iteration of the three-layered Goertzel algorithm may be used to keep rack of trends in the magnitude and frequency of the identified potential feedback frequencies.

For discussion purposes, the buffer where the calculated frequencies in the mid-band are stored, will be called MFreqBuff and the frequencies from the narrow-band will be called NFreqBuff. The respective buffers where magnitude values are placed will be called MMagBuffA for the mid-values from the 'A' buffer, and NMagBuffB for the mid-values from the 'B' buffer. The respective values from the narrow-band will be called NMagBuffA and NMagBuffB. The values in each of these buffers will be identified in sequence by appending a "[ ]" to the name with a zero based index value representing the value in time stored in each buffer. For example the current frequency value associated with the narrow-band will be identified as NFreqBuff[0]. The previous frequency value will be NFreqBuff[1], etc.

After starting the update method at step 502, the next step of the algorithm is to see if the frequency change criteria are satisfied at step 504. This is accomplished by comparing the current and previous frequencies calculated in the narrow-band as well as the current frequencies in the narrow- and mid-bands as follows: If NFreqBuff[0]=NFreqBuff[1] and NFreqBuff[0]=MFreqBuff[0] then the No Frequency Change Count gets incremented at step 508. If the preceding relationship is not true then the No Frequency Change Count is cleared at step 506.

Next, the method determines if the constant growth criterion for the frequency's magnitude is satisfied at step 510. Verifying that there is no decay in the magnitude is determined if (NMagBuffA[0]<NMagBuffB[0]) and (NMagBuffA[1]<NMagBuffB[1]) and (NMagBuffB[1]<NMagBuffA[0]). If this is true, then the Constant Magnitude Growth Count gets incremented at step 512. If it is not true then the Constant Magnitude Growth Count is cleared at step 514.

The final part of the updating method of FIG. 5 is to determine if the long term constant magnitude criteria is satisfied at step 516. Verifying that there are no significant changes in magnitude over a longer period of time is determined if ((NMagBuffB[0]−NMagBuffB[1])<−0.5 dB) and ((NMagBuffB[0]−NMagBuffB[1])>3.0 dB) and ((NMagBuffB[0]−NMagBuffB[ConsCount])>−0.5 dB). If this relationship is true, then the Long-Term Constant Magnitude Count is incremented at step 518. If it is not true then Long-Term Constant Magnitude Count is cleared at step 520. Having updated these statistics, this portion of the feedback control algorithm ends at step 522.

Determining if the Current Frequency is a Potential Feedback Frequency

Figure 6:
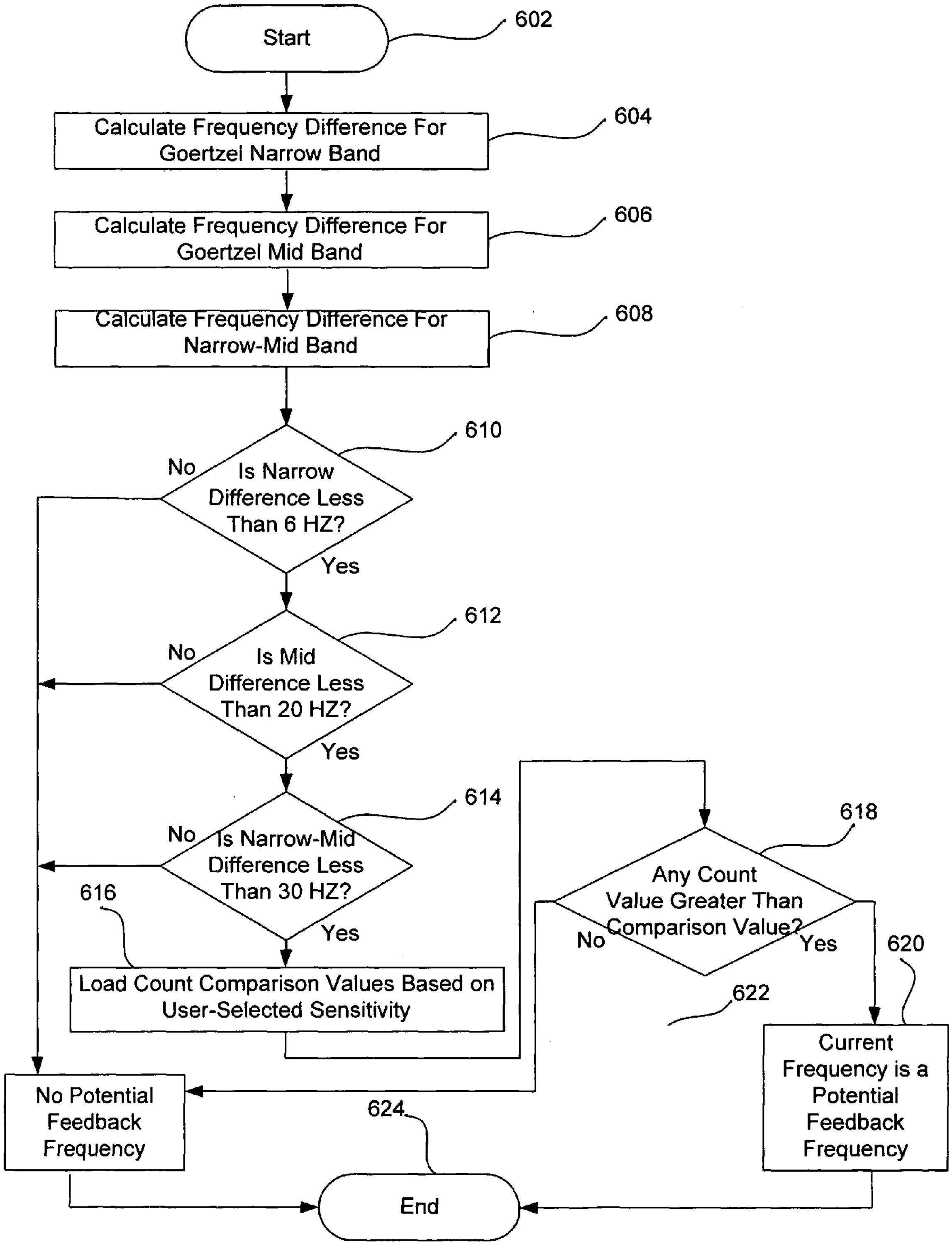
FIG. 6 is a more detailed flow chart outlining the process from FIG. 2 for determining if the current frequency represents a potential feedback frequency according to an embodiment of the invention.

FIG. 6 is a more detailed flow chart outlining the process from FIG. 2 for determining if the current frequency represents a potential feedback frequency according to an embodiment of the invention. In this portion of the feedback control algorithm, the initial steps shown in FIG. 6 are used to determine if the current frequency content in the local spectrum is consistent. The method begins at step 602 where frequency differences are calculated. First, the narrow-band frequency difference between the current and previous frequency calculations is determined (NarrowDiff=|NFreqBuff[0]−NFreqBuff[1]|) at step 604. Second, the mid-band frequency difference between the current and previous frequency calculations is determined (MidDiff=|MidFreqBuff[0]−MidFreqBuff[1]|) at step 606. Thirdly, the current frequency difference between the narrow- and mid-bands is calculated (NarrowMidDiff=|NFreqBuff[0]−MFreqBuff[0]|) at step 608. After these three frequency differences are calculated, they are compared to predetermined thresholds for each respective calculation. If any one difference is greater then its corresponding threshold, then the current frequency is not considered a potential feedback frequency. The three checks are as follows: if NarrowDiff is greater then 6 Hz (step 610), if MidDiff is greater then 20 Hz (step 612), or if NarrowMidDiff is greater then 30 Hz (step 614) then the current feedback frequency is not a potential feedback frequency. If all three checks pass, then the count comparison values (as calculated and described in FIG. 5.) and MaxThreshold value are loaded into memory for comparison (at step 616) based on a user-selected parameter for sensitivity.

The invention may further include additional control elements giving the user more flexibility in deploying feedback filters. One such element includes a set of user adjustable parameters that allow a tradeoff between speed of detection and accuracy of discrimination of feedback. These settings are categorized into three groups from which the user selects depending on the application into which the invention is placed. These settings are most sensitive (and least discriminating), moderate sensitivity (and moderate discrimination) and least sensitive (and most discriminating).

The most sensitive setting is the fastest in detecting a potential feedback frequency. However, the most sensitive setting exhibits the least ability to discriminate non-feedback sounds, such as music, from actual feedback tones. In one embodiment, three potential values the user can select from are Most Sensitive (least discriminating), Moderate Sensitivity (moderate discrimination) and Least Sensitive (most discriminating). For each setting, the current frequency is placed into one of four frequency bands, and then based on the frequency value, four values are loaded into memory for comparison purposes. Three of these values are the count values described in FIG. 5. They include Frequency Change Count (NoDiffCount), Constant Magnitude Growth Count (ConsGrowthCount), and Constant Magnitude Count (ConsCount). The fourth value is the MaxThreshold value that is used to determine the magnitude value beyond which a frequency is considered a potential feedback frequency. The following table shows the criteria for selecting which set of 4 values are loaded:

| | User Selection: Most Sensitive (least discriminating) | User Selection: Moderate Sensitivity (moderate discrimination) | User Selection: Least Sensitive (least discriminating) |
|---|---|---|---|
| | Frequency <800 Hz | Frequency <1500 Hz | Frequency <2500 Hz |
| NoDiffCount | 2 | 3 | 4 |
| ConsGrowthCount | 3 | 3 | 5 |
| ConsCount | 4 | 6 | 8 |
| MaxThreshold | −15 dBFS | −15 dBFS | −8 dBFS |
| | Frequency: 800-1000 Hz | Frequency: 1500-3000 Hz | Frequency: 2500-5000 Hz |
| NoDiffCount | 2 | 2 | 3 |
| ConsGrowthCount | 1 | 2 | 5 |
| ConsCount | 3 | 3 | 6 |
| MaxThreshold | −20 dBFS | −25 dBFS | −15 dBFS |
| | Frequency: 1001-2000 Hz | Frequency: 3001-4000 Hz | Frequency: 5001-8000 Hz |
| NoDiffCount | 1 | 2 | 2 |
| ConsGrowthCount | 1 | 2 | 3 |
| ConsCount | 2 | 3 | 3 |

-continued

| | User Selection: Most Sensitive (least discriminating) | User Selection: Moderate Sensitivity (moderate discrimination) | User Selection: Least Sensitive (least discriminating) |
|---|---|---|---|
| MaxThreshold | −30 dBFS<br>Frequency: >2000 Hz | −30 dBFS<br>Frequency: >4000 Hz | −20 dBFS<br>Frequency: >8000 Hz |
| NoDiffCount | 1 | 2 | 2 |
| ConsGrowthCount | 1 | 2 | 2 |
| ConsCount | 2 | 2 | 2 |
| MaxThreshold | −40 dBFS | −40 dBFS | −30 dBFS |

After values are loaded based on the user's sensitivity selection and the current frequency value, comparisons may be made against NoDiffCount, ConsGrowthCount and ConsCount at step 618. If any of the count values are greater then or equal to the values loaded based on the sensitivity selection, then the current frequency is considered a potential feedback frequency at step 620. If none of the count values are greater then or equal to the values loaded, then the current frequency is not considered a potential feedback frequency at step 622. In either case, this portion of the feedback control algorithm ends at step 624.

Determining if the Decay Criteria is Satisfied

Figure 7:
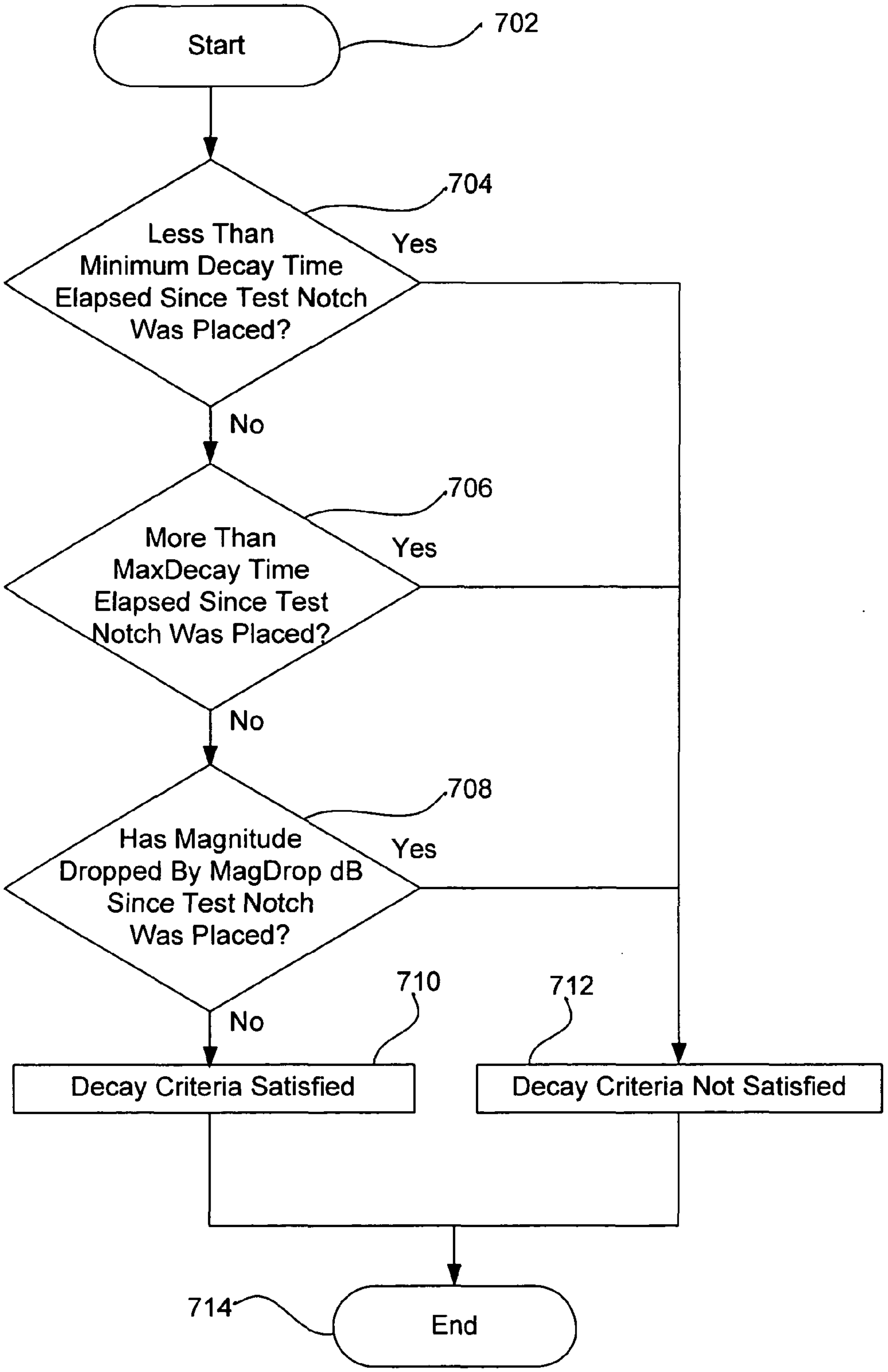
FIG. 7 is a more detailed flow chart that shows the process from FIG. 2 of deciding if the decay criterion has been met for a candidate feedback frequency after a test notch filter has been placed according to an embodiment of the invention.

FIG. 7 is a more detailed flow chart that shows the process from FIG. 2 of deciding if the decay criterion has been met for a candidate feedback frequency after a test filter has been placed according to an embodiment of the invention. This portion of the feedback control algorithm begins at step 702. Then, the method determines if the decay criterion has been met. That is, determining whether or not the Minimum Decay Time has elapsed since the test filter was placed at step 704. In this embodiment, the Minimum Decay Time is equal to two iterations of the three-layered Goertzel algorithm or approximately 280 ms. If two or more iterations have elapsed, then a check is performed to see if exactly two iterations have elapsed at step 706. If two iterations have elapsed since the test filter was placed, then the magnitude and frequency of the potential feedback frequency are checked at step 708. If either the frequency has shifted by more then a Maximum Frequency Shift in Hz or the magnitude has dropped by at least Maximum Magnitude Drop in dB, then the decay criteria is considered satisfied at step 710. Otherwise the decay criteria is not satisfied, at step 712, as is the case with any of the previous determination resulting in a 'yes' determination. In one embodiment, the Maximum Frequency Shift is equal to 20 Hz and Maximum Magnitude Drop is equal to 6 dB. Whether the decay criteria are satisfied (step 710) or not (step 712), this portion of the feedback control algorithm ends at step 714.

Once a feedback frequency is identified and a permanent filter is placed, the permanent filter typically remains deployed until cleared by the user. In alternative embodiments, the permanent filter may clear itself after a predetermined amount of time. In still other embodiments, the permanent filter may undeploy after additional growth characteristics are analyzed to determine that the feedback element is no longer present in the audio signal. The bandwidth and depth of any deployed permanent filters may also be controlled by the user via the user interface.

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

I claim:

1. A method for identifying feedback, the method comprising:

determining a candidate frequency within a plurality of frequencies in a signal, the determined frequency having a signal with a first magnitude a first instance in time, the candidate frequency determined by a three-layered, narrowing band iterative process whereby a determined frequency corresponding to a maximum magnitude in a first frequency band at a first iteration becomes a center frequency for a frequency band of a second iteration and a determined frequency corresponding to a maximum magnitude in a second frequency band becomes a center frequency for a frequency band of a third iteration;

determining if the signal at the candidate frequency exhibits a growth characteristic by determining if the signal has a second magnitude that is greater than the first magnitude at a second instance in time after the first instance in time;

deploying a test filter having a center frequency equal to the candidate frequency;

determining if magnitude growth of the candidate frequency subsequently decays after the engaging of the test filter such that the signal at the candidate frequency no longer exhibits a continuous increase in magnitude with respect to time; and if the candidate frequency decays in magnitude growth, determining that the candidate frequency is a feedback frequency and deploying a permanent filter having a center frequency equal to the candidate frequency.

2. The method of claim 1 wherein engaging the test filter comprises deploying a digital notch filter from a bank of user-adjustable notch filters.

3. The method of claim 2 wherein engaging the test filter further comprises setting the user-adjustable notch filter to a user-defined filter parameters.

4. The method of claim 1, further comprising setting user-controllable sensitivity settings that control the determining of the candidate frequency.

5. The method of claim 1, further comprising setting user-controllable sensitivity settings that control the determining of the magnitude growth decay of the candidate frequency.

6. The method of claim 1, further comprising undeploying the test filter after the permanent filter has been deployed.

7. The method of claim 1, further comprising determining if magnitude growth of the candidate frequency subsequently does not decay undeploying the test filter and determining that the candidate frequency is not a feedback frequency.

8. The method of claim 1, further comprising iteratively scanning the frequency spectrum of the signal to determine subsequent candidate frequencies.

9. The method of claim 1, further comprising:

converting the signal from an analog signal to a digital signal prior to determining the candidate frequency; and converting the signal from a digital signal to an analog signal subsequent to analog-to-digital conversion.

10. An electronic circuit for identifying feedback in an audio signal, the electronic circuit comprising:

a feedback control block operable to determine a candidate frequency having potential feedback, the candidate frequency determined by a three-layered, narrowing band iterative process whereby a determined frequency corresponding to a maximum magnitude in a first frequency band at a first iteration becomes a center frequency for a frequency band of a second iteration and a determined frequency corresponding to a maximum magnitude in a second frequency band becomes a center frequency for a frequency band of a third iteration, the feedback control block further operable to perform an iterative analysis of the magnitude of the audio signal at the candidate frequency to determine the growth characteristics of the signal, such that after a first magnitude determination at a first instance in time, the magnitude of the audio signal is greater at a second instance in time;

a test filter block operable to deploy a test filter at a candidate frequency; and a permanent filter block operable to deploy a permanent filter at the candidate frequency if the feedback control block determines that the growth characteristics of the signal at the candidate frequency are eliminated after the test filter has been deployed such that at a third instance in time after the first and second instances in time, the magnitude of the audio signal is not greater.

11. The electronic circuit of claim 10, further comprising a user interface embodied in a computer platform and having software-enabled control features such that a user may control the feedback control block via the software executing on the computer platform.

12. The electronic circuit of claim 11 wherein the user interface further comprises a user-controllable sensitivity setting operable to control parameters of the analysis of the growth of the magnitude of the audio signal at the candidate frequency.

13. The electronic circuit of claim 11 wherein the user interface further comprises a force filter parameter that, when set, deploys the permanent filter after determining the candidate frequency and without iteratively analyzing the growth characteristics of the audio signal.

14. The electronic circuit of claim 11 wherein the user interface further comprises settings for analyzing the growth characteristics, the settings including a setting for maximum decay time, minimum decay time, magnitude drop, and magnitude growth count.

15. The electronic circuit of claim 10, further comprising an analog-to-digital converter for converting the audio signal from analog to digital prior to the feedback control block and a digital-to-analog converter for converting the audio signal from digital to analog after the feedback control block.

16. The electronic circuit of claim 10 wherein the permanent filter comprises a digital filter within a block of digital filters, each of which are operable to be deployed simultaneously across several frequencies as determined by the feedback control block.

17. The electronic circuit of claim 10, embodied within a rack-mountable standalone outboard device.

18. A system for controlling feedback in audio signals, the system comprising:

a pre-amplifier operable to amplify a weak analog audio signal;

an analog-to-digital converter coupled to the preamplifier and operable to convert the pre-amplified analog audio signal into a digital audio signal;

a feedback suppression circuit coupled to the analog-to-digital converter, the feedback suppression circuit including:

a feedback control block operable to determine a candidate frequency having potential feedback, the candidate frequency determined by a three-layered, narrowing band iterative process whereby a determined frequency corresponding to a maximum magnitude in a first frequency band at a first iteration becomes a center frequency for a frequency band of a second iteration and a determined frequency corresponding to a maximum magnitude in a second frequency band becomes a center frequency for a frequency band of a third iteration, the feedback control block further operable to perform an iterative analysis of the magnitude of the audio signal at the candidate frequency to determine the growth characteristics of the signal, such that after a first magnitude determination at a first instance in time, the magnitude of the audio signal is greater at a second instance in time;

a test filter block operable to deploy a test filter at a candidate frequency; and a permanent filter block operable to deploy a permanent filter at the candidate frequency if the feedback control block determines that the growth characteristics of the signal at the candidate frequency are eliminated after the test filter has been deployed such that at a third instance in time after the first and second instances in time, the magnitude of the audio signal is not greater;

a digital-to-analog converter coupled to the feedback suppression circuit and operable to convert the digital audio signal into an analog audio signal; and an amplifier coupled to the digital-to-analog signal converter and operable to amplify the analog audio signal.

19. The system of claim 18, further comprising a computing environment for realizing the feedback suppression circuit and coupled to a user interface operable to control the feedback suppression circuit.

20. The system of claim 18, further comprising a microphone for inputting acoustic sound waves into weak analog signals for pre-amplification and a speaker for outputting amplified audio signals into acoustic sound waves.

* * * * *